(12) United States Patent
Odaka et al.

(10) Patent No.: US 9,397,316 B2
(45) Date of Patent: Jul. 19, 2016

(54) OLED DISPLAY PANEL

(71) Applicant: Japan Display Inc., Tokyo (JP)

(72) Inventors: Kazuhiro Odaka, Tokyo (JP); Yuichi Numata, Tokyo (JP)

(73) Assignee: JAPAN DISPLAY INC., Tokyo (JP)

(*) Notice: Subject to any disclaimer, the term of this patent is extended or adjusted under 35 U.S.C. 154(b) by 12 days.

(21) Appl. No.: 14/087,172

(22) Filed: Nov. 22, 2013

(65) Prior Publication Data

US 2014/0145164 A1 May 29, 2014

(30) Foreign Application Priority Data

Nov. 29, 2012 (JP) .................................. 2012-261681

(51) Int. Cl.
*H01L 51/52* (2006.01)
*H01L 27/32* (2006.01)

(52) U.S. Cl.
CPC .......... *H01L 51/529* (2013.01); *H01L 27/3276* (2013.01)

(58) Field of Classification Search
CPC ... H01L 51/529; H01L 51/50; H01L 27/3297; H05B 33/24
See application file for complete search history.

(56) References Cited

U.S. PATENT DOCUMENTS

| 6,232,142 | B1 | 5/2001 | Yasukawa | |
|---|---|---|---|---|
| 2005/0269947 | A1* | 12/2005 | Kobayashi | .......... H01L 27/3211 313/504 |

FOREIGN PATENT DOCUMENTS

| JP | 4553991 | 7/2010 |
|---|---|---|
| WO | WO 99/30370 A1 | 6/1999 |

* cited by examiner

*Primary Examiner* — Fernando L Toledo
*Assistant Examiner* — Lawrence-Linh T Nguyen
(74) *Attorney, Agent, or Firm* — Typha IP LLC

(57) ABSTRACT

An OLED display panel is provided which can dissipate heat generated from a circuit on the OLED display panel to the exterior using a structure which can rapidly reduce costs. A metal film 2 and insulation film 3 are formed between a glass substrate 1 and TFT drive circuit layer 4 in sequence from the side of the glass substrate 1. The metal film 2 conducts with a heat dissipation pattern 5b formed above the TFT drive circuit layer 4 from the metal film via a contact 15 which passes through the insulation film 3 and TFT drive circuit layer 4. The heat dissipation pattern 5b is connected to a metal frame 20 via a heat dissipation tape 21.

10 Claims, 4 Drawing Sheets

OLED DISPLAY PANEL

CROSS-REFERENCE TO RELATED APPLICATIONS

This application is based upon and claims the benefit of priority from the prior Japanese Patent Application No. 2012-261681 filed on Nov. 29, 2012, the entire contents of which are incorporated herein by reference.

FIELD

The present invention is related to an OLED (organic light-emitting diode) display panel.

BACKGROUND

In recent years the development of OLED display panels is progressing with the aim of increased thinner, high luminosity and high speed display panels. These OLED panels are formed from pixels each of which is comprised from at least three organic compound light-emitting diodes (OLED light-emitting elements) which individually emit light of three colors (red, blue, green). Since the pixels do not contain any mechanical operations, they have a fast reaction speed and because each pixel itself emits light, high luminosity display is possible. In addition, because a backlight is unnecessary, a thin OLED display can be realized for next generation display panels.

These OLED display panels have a structure in which multiple OLED light-emitting elements corresponding to each pixel of an image to be display are formed in the shape of a matrix on a single substrate (glass substrate) and above this a transparent facing substrate is bonded for preventing light being emitted externally. Each OLED light-emitting element is comprised from a TFT (Thin Film Transistor) drive circuit layer, a reflection anode, a hole injection layer, a hole transport layer, an organic EL (Electro Luminescence) light-emitting layer, an electron transport layer, an electron injection layer, and a transparent cathode in this order from the substrate.

Among these, the organic EL light emitting layer which emits light is weak to heat since it is comprised from an organic material causing a change in its characteristic due to a peripheral temperature which is a significant problem. Therefore, conventionally a technology is proposed in which heat which is generated from a circuit (driver, circuit, register, power supply circuit etc.) for driving each OLED light-emitting element formed on an OLED display panel, or a TFT drive circuit forming the OLED light-emitting element, is controlled from being conducted to the organic EL light-emitting layer.

For example, a structure is conventionally proposed in which a heat diffusion sheet comprised from aluminum, copper or graphite is attached to the rear surface of an OLED display panel and heat generated on a circuit of one part is dissipated to the entire region of the OLED display panel via the heat diffusion sheet thereby preventing a high temperature section from being generated on a single part of the OLED display panel.

In addition, although patent document 1 (U.S. Pat. No. 4,553,991) is related to an LCD panel, a technology is proposed in which a conduction film comprised from a high melting point metal such as molybdenum for example is formed on the entire upper surface of a substrate in order to make the distribution of heat generated from a TFT or periphery circuit for driving each pixel uniform.

However, according to the technology of attaching a heat diffusion sheet to the rear surface of an OLED display panel, a separate process of attaching a heat diffusion sheet is necessary in addition to the manufacturing process of the OLED display panel and therefore processing costs for attaching the heat diffusion sheet in addition to the component costs of the heat diffusion sheet are necessary leading to high costs which is a problem.

In addition, even if the structure described in the patent document 1 is applied to an OLED display panel, the effects stop at uniformity of the heat distribution of the display panel and no consideration has been paid to heat dissipation externally. Therefore, the problem arises where heat accumulates across the entire display panel with time and finally the temperature of the organic EL light-emitting layer increases which is a problem.

In view of the above, the present invention attempts to provide an OLED display panel which easily dissipates heat generated from a circuit on the OLED display panel to the exterior using a structure which can rapidly reduce costs.

SUMMARY

An organic EL display panel according to the present invention is arranged with an organic light-emitting element configured to emit light in response to a signal supplied from a terminal electrode, the panel including a substrate, a metal film formed above the substrate, an insulation film formed above the metal film, a drive circuit layer including a circuit formed above the insulation film for driving the organic light-emitting element based on the signal, and a metal contact configured to pass through the insulation film and the drive circuit layer and having one end contacting with the metal film.

DESCRIPTION OF EMBODIMENTS

Figure 1:
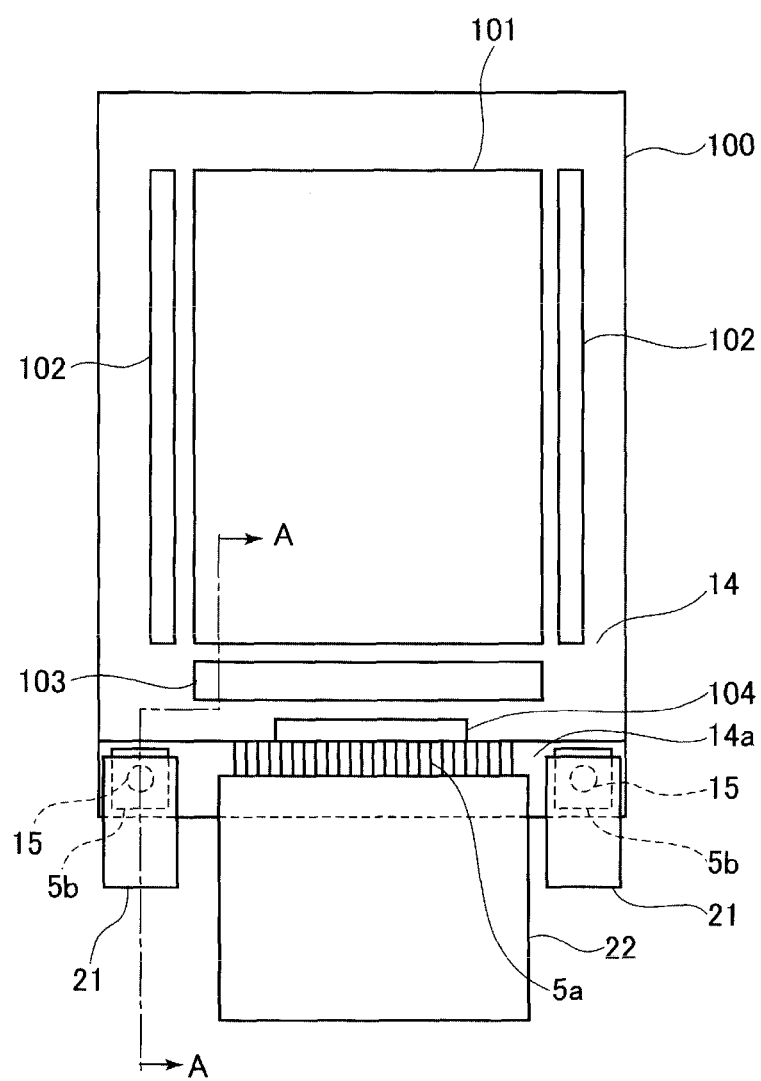
FIG. 1 is a planar view diagram of an OLED panel according to a first embodiment.

The best embodiments for realizing a manufacturing method of an OLEO display panel 100 according to the present invention are explained below based on the drawings. In each of the embodiments described below, a metal film 2 for heat diffusion and heat dissipation is formed between a surface of a glass substrate 1 which forms the OLEO display panel 100 and an insulation film 3 formed conventional on the glass substrate surface. A contact 15 which connects the metal film 2 described above and a heat dissipation pattern 5b formed on an aluminum wiring pattern layer 5 which forms the outermost later of a TFT drive circuit layer 4 formed on the insulation film 3 is formed to pass through the insulation film 3 and TFT layer 4. A heat dissipation tape 21 is bridged between the heat dissipation pattern 5b and an external heat structural body (a metal frame 20 for supporting and fixing the OLEO display panel etc.). Using this structure, heat generated by a circuit on the OLEO display panel 100 is absorbed by the metal film 2, transmitted to the external heat dissipation structural body via the contact 15, heat dissipation pattern 5b and heat dissipation tape 21, and dissipated by the external heat dissipation structural body.

First Embodiment

Figure 2:
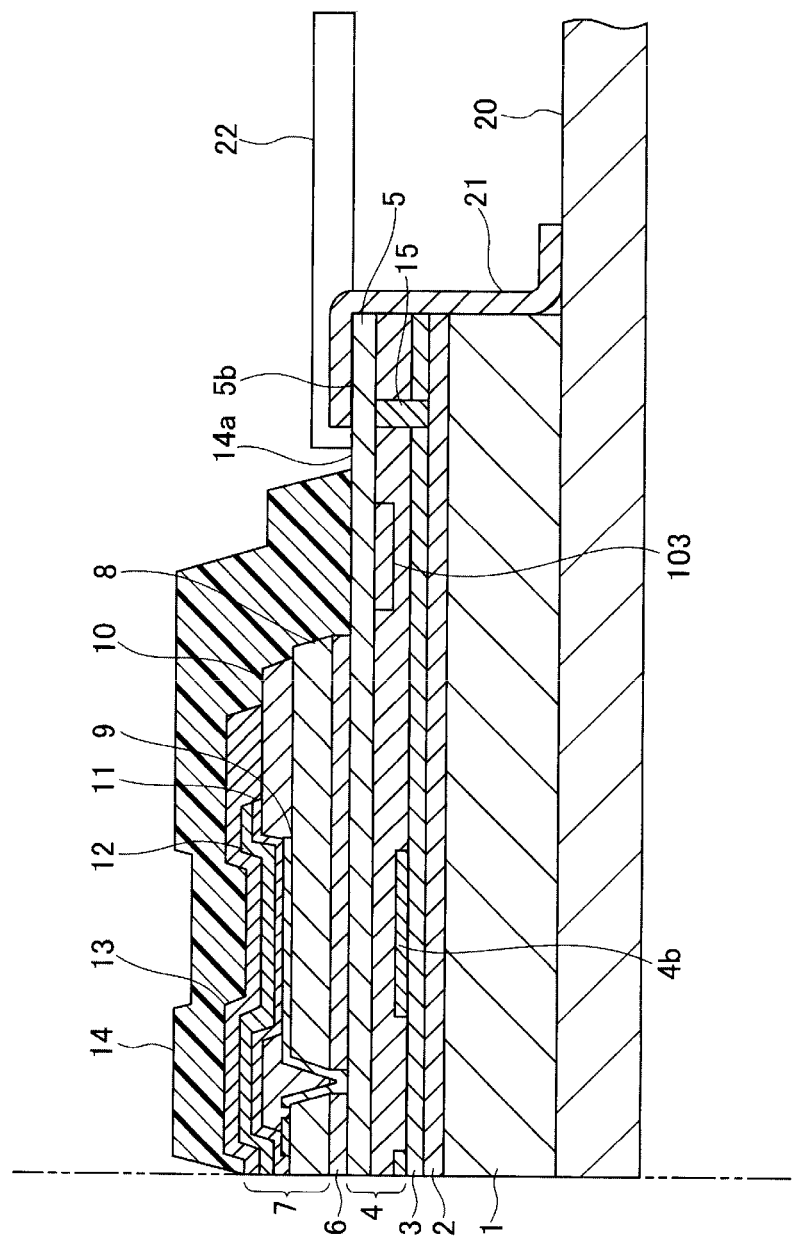
FIG. 2 is a vertical cross-sectional diagram of an OLED panel according to a first embodiment.

FIG. 1 is a planar view diagram of the OLED display panel 100 including the structure described above and FIG. 2 is a vertical cross-sectional view diagram along the line A-A in FIG. 1. Furthermore, although the double-dotted chain line shown in FIG. 2 shows that the structure to the left side of the line is linked, an illustration of this structure is omitted from the diagram.

As is shown in FIG. 1, in a planar view, multiple OLED light-emitting elements are arranged in a matrix shape at the center of the OLED display panel 100. A display area 101 is formed in which an image is displayed by selectively driving these OLED light-emitting elements. In addition, drive circuits (X driver, Y driver, shift register etc.) 102, 103 for selectively driving each OLED light-emitting element within the display area 101 are arranged in three places on the periphery region (referred to in the present specification below as [edge region]) of the display area 101 on the upper surface of the OLED display panel. Furthermore, a COG (Chip On Glass) 104 is arranged parallel to the drive circuit 103 on the exterior side of the drive circuit 103 at the edge region along the short side of the display area 101.

The surface of the OLED display panel 100 including the sections where the display area 101 and each drive circuit 102, 103 are formed is covered by a sealing film 14 comprised from an insulation material. However, the sealing film 14 is removed from a connectors region 14a near an edge of the side on which the COG 104 is arranged which exposes an end part (stripe shaped connector electrode 5a) of multiple wiring patterns. These wiring patterns are electrically conductive with each drive circuit 102, 103 through the COG 104 and are for connecting to ground as well as supplying a power supply voltage or drive signal to each of these circuits. In addition, a flexible circuit substrate 22 connected to an external circuit such as a signal processing circuit not display in the diagram is connected to the connector electrode 5a.

Both sides of the connector electrode 5a in the connector region 14a form a large dead space in which a wiring pattern is not formed. Thus, in this example, heat dissipation patterns 5b, 5b which include a sufficiently wider area and width than individual electrodes which form the connector electrode 5a or wiring connected to the connector electrode 5a are formed in this space. The heat dissipation patterns 5b, 5b are formed from the same aluminum thin film as the connector electrode 5a or wiring pattern connected to the connector electrode 5a. The connector patterns 5b, 5b are also exposed to external air. The heat dissipation tape 21 made from a metal (aluminum, copper) with a high heat conduction rate or graphite is bridge between the surface each heat dissipation pattern 5b, 5b and the metal frame 20 (refer to FIG. 2) for supporting and fixing the OLED display panel 100.

Furthermore, in the case where the heat dissipation tape 21 is comprised from a material with excellent conductivity, each heat dissipation pattern 5b, 5b may also be connected to ground through the heat dissipation tape 21 and the metal frame 20 (refer to FIG. 2). In addition, a wiring pattern which conducts electricity between each heat dissipation pattern 5b, 5b and a ground electrode within the connector electrode 5a may also be formed.

As is shown in FIG. 2, a metal film 2 is formed to cover the entire surface of the glass substrate 1 which becomes a base in the manufacturing method of the OLED display panel 100.

The metal film 2 is formed from a metal (for example, copper, aluminum, chrome, tungsten, molybdenum etc.) having a high heat dissipation rate.

The insulation film 3 is formed on the entire upper surface of the metal film 2. Apart from a connector 15 explained below, the metal film 2 prevented from being electrically conductive with other structural components using this structure.

A TFT drive circuit layer 4 is formed above the insulation film 3. The TFT drive circuit layer 4 is a layer in which TFT 4a of each OLED element within the display region 101 and the drive circuits 102, 103 are formed by combining a poly-silicon film, metal electrode or insulation layer. The upper most layer among the multiple layers which form the insulation film 3 is an aluminum wiring pattern layer 5. The aluminum wiring pattern layer 5 connects each drive circuit 102, 103 described above with TFT 4a of each OLED light-emitting element or transparent cathode 13, or connects each drive circuit 102, 103 with the connector electrode 5a and the heat dissipation patterns 5b, 5b described above are formed. In this way, the aluminum wiring pattern layer 5 is formed from a pattern of multiple aluminum thin film. In FIG. 2, the aluminum wiring pattern layer 5 is depicted as linked because a cross section is shown along a wiring pattern linked to the ground electrode in an example where the heat dissipation pattern 5b is conductive with the ground electrode within the connector electrode 5b.

A contact 15 which passes through an insulation film and insulation film 3 in the TFT drive circuit layer 4 is formed directly below each heat dissipation pattern 5b, 5b in the aluminum wiring pattern layer 5. The metal film 2 and each heat dissipation pattern 5b become electrically conductive via this contact 15.

In the display region 101 of the OLED display panel 100, an OLED layer 7 which forms each OLED light-emitting element is formed sandwiching the insulation film 6 above the aluminum wiring pattern layer 5. The OLED layer 7 is the same as a conventional OLED layer in that it includes a structure whereby a planarized layer 8, anode (reflection electrode) 9, organic EL light-emitting later (including a hole transport layer) 11, an electron transport layer 12 and transparent cathode 13 are stacked in sequence from the insulation film 6. Although this is referred to as a top emitting type structure, if an aperture which allows light emitted from the organic EL light-emitting layer to pass through is formed on the metal film 2, the present invention can also be applied to an OLED panel having a bottom emitting type OLED light-emitting element with the anode described above converted to a transparent electrode. Furthermore, in the case of bottom emitting type, the cathode may be converted to a reflection electrode and each layer may be stacked in the reverse order to the order described above. In addition, the bank 10 in FIG. 2 is a bank for sectioning each OLED light-emitting element from an adjacent OLED light-emitting element.

As described above, apart from the connector region 14a, the aluminum wiring pattern layer 5 in the edge region and the OLED layer 7 in the display region 101 are collectively sealed from the external atmosphere by a sealing layer 14 comprised from a series of transparent insulation materials.

When a voltage power supply and control signal are supplied from an external circuit to the OLED display panel 100 according to the present embodiment including the structure described above, the drive circuits 102, 103 and the TFT 4a of each OLED display element begin to operate in response to a control signal and a current flowing via the power supply voltage is made to intermittently pass through and discharge to ground. As a result, Joule heat is generated in a circuit, in particular the drive circuits 102, 103 and TFT 4a of each OLED display element, in which the current within the TFT drive circuit layer 4 flows.

Joule heat generated in the way is initially conducted equally in a vertical direction. However, there is a metal film 2 at a position in which the distance from the part where the Joule heat is generated is closer than the distance up to the organic EL layer 12. The metal film 2 has a much better heat conduction rate than the material which forms an OLED light-emitting element and moreover since the metal film 2 contacts the metal frame 20 via the contact 15 which is similarly made from metal, the heat dissipation pattern 5b and heat dissipation tape 21, Joule heat flows into the metal film 2 before reaching the organic EL layer 12. This Joule heat us conducted the metal frame 20 via the contact 15, heat dissipation pattern 5b and heat dissipation tape 21, and is diffused within the metal frame 20 which has high heat dissipation rate and large area and volume. Consequently, since any subsequently generated Joule heat flows (cooled) to the metal layer 12, the Joule heat is prevented from reaching the organic EL layer 12. As a result, since it is possible to prevent the OLED light-emitting element from locally receiving the effects of a heat source, it is possible to prevent partial deterioration of an OLED light-emitting element from progressing.

According to the present embodiment, conventionally the contact 15 is formed to pass through the metal film 2 in a region with a dead space and few wires on both sides of the connector electrode 5a. Therefore, each heat dissipation pattern 5b which passes through to the upper end of the contact 15 can be formed with a sufficiently wide width and large area compared to other wiring patterns. In addition, each of these heat dissipation patterns 5b is connected to the metal frame 20 through the heat dissipation tape 21 which has a high heat conduction rate and the same or wider width as the heat dissipation pattern 5b. Therefore, Joule heat which is generated within the TFT drive circuit later 4 can be efficiently conducted to the metal frame 20.

Furthermore, in the case where each heat dissipation pattern 5b is connected to ground though the heat dissipation tape 21 and metal frame or a ground electrode and flexible print substrate 22 within the connector electrode 5a, it is possible to provide the metal film 2 with a function for shielding external magnetic noise.

Second Embodiment

Figure 3:
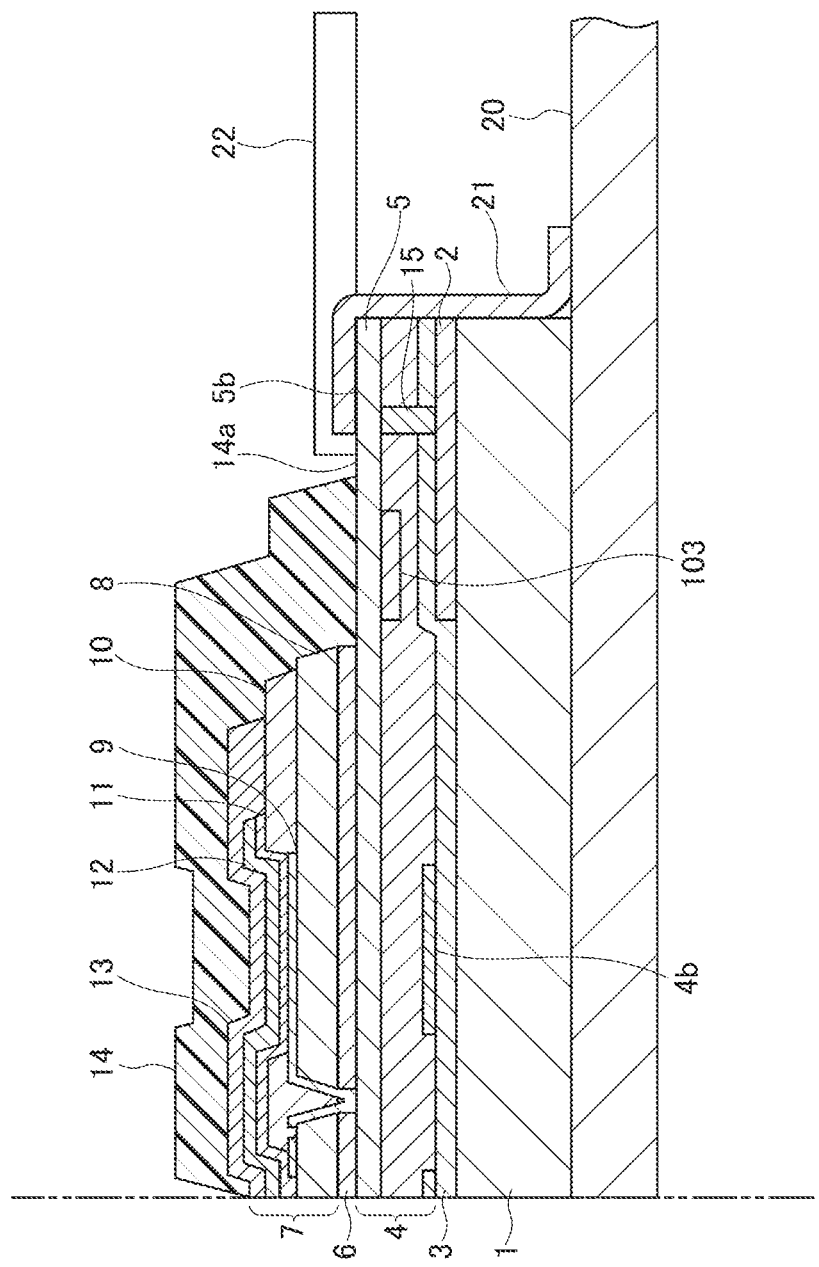
FIG. 3 is a vertical cross-sectional diagram of an OLED panel according to a second embodiment.

FIG. 3 is a vertical cross-sectional diagram (vertical cross-sectional diagram along the line A-A in FIG. 1) which shows a second embodiment of an OLED panel according to the present invention.

In the first embodiment described above, the metal film 2 was formed across the entire upper surface of the glass substrate 1. In the second embodiment however, the metal film 2 is formed only on the lower part of the drive circuits (X driver circuit, Y driver circuit, shift register, power supply circuit etc.) 102, 103 which have a particularly high amount of heat generation in the TFT drive circuit layer 4 by patterning but is not formed on the lower part of the display region 101. With this structure, it is also possible to provide the effect of making it difficult for Joule heat generated from a drive circuit having a large amount of generated heat to be conducted to an organic EL light-emitting layer of each OLED display element formed on the display region 101.

Since the other structure and effects in the second embodiment are the same as those described in the first embodiment, an explanation is omitted here.

Third Embodiment

Figure 4:
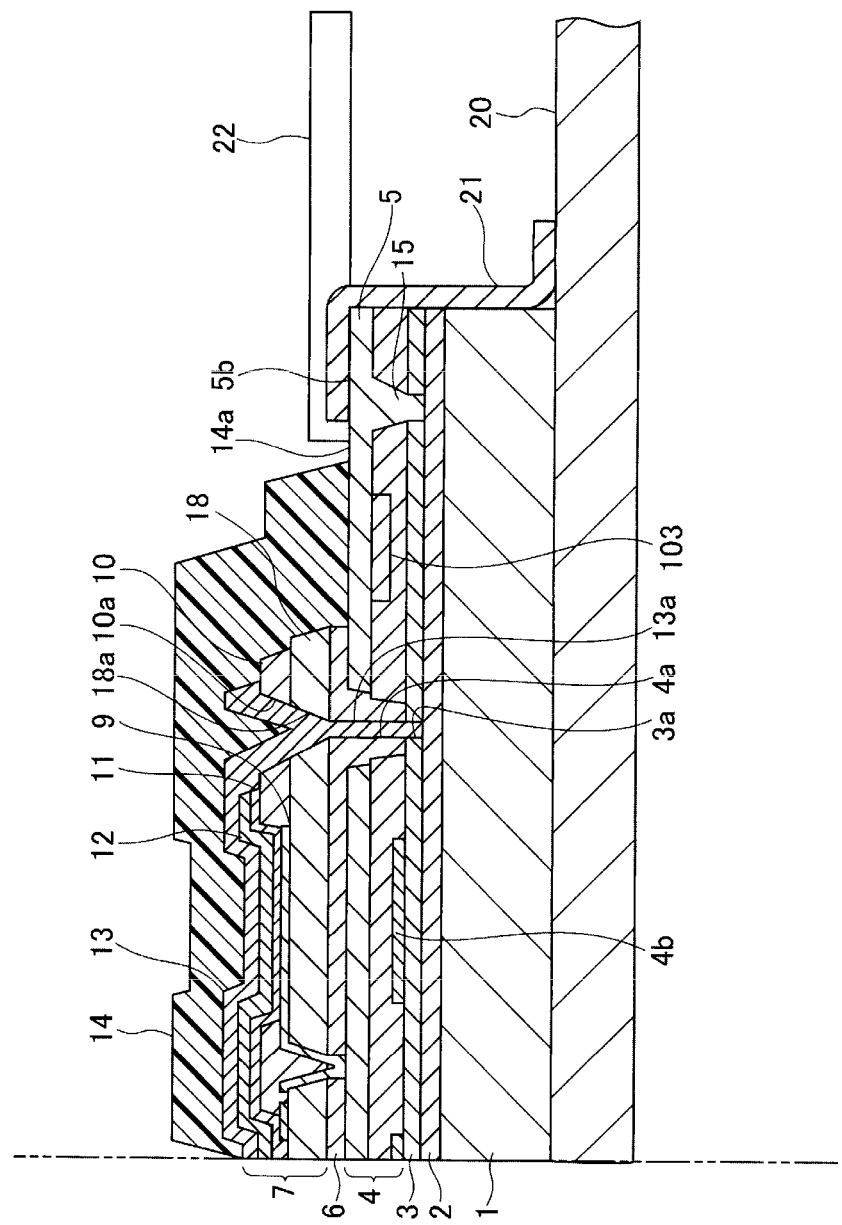
FIG. 4 is a vertical cross-sectional diagram of an OLED panel according to a third embodiment.

FIG. 4 is a vertical cross-sectional diagram (vertical cross-sectional diagram along the line A-A in FIG. 1) which shows a third embodiment of an OLED panel according to the present invention.

An explanation was provided in the first embodiment described above (and in the second embodiment having the same structure) whereby each heat dissipation pattern 5b which conducts with the metal film 2 can also be connected to ground. However, in the third embodiment, each heat dissipation pattern 5b and a transparent cathode 13 of each OLED light-emitting element which should similarly be connected to ground are directly conductive with the metal film 2. In this way, the transparent cathode 13 is connected to ground through the contact 15, each heat dissipation pattern 5b, heat dissipation tape 21 and metal frame 20, or through the contact 15, each heat dissipation pattern 5b, connector electrode 5 and flexible circuit substrate 22.

Specifically, in the third embodiment, contact holes 10a, 18a, 4a and 3a are formed to pass through the bank 10, planarized layer 18, insulation film 6, TFT drive circuit layer 4 and insulation film 3. The transparent cathode 13 includes a contact 13a as a single unit formed so that the interiors of the contact holes 10a, 18a, 4a and 3a are filled in. The end of the contact 13a is conductive with the upper surface of the metal film 2.

Since there is no restriction to the diameter of the contact 13a, it is possible to increase the contact area with the metal film 2 as much as possible. In addition, because it is possible to omit a wiring pattern which directly connects the transparent cathode 13 of each OLED light-emitting element and the connector electrode 5a from the aluminum wiring pattern layer 5, it is possible to increase the width and area of each heat dissipation pattern 5b by this amount. Therefore, the area of the upper end of each contact 15 can also be increased by this amount.

In this way, since it is possible to increase the contact area with the contact 13a and the contact area between each contact 15 and each heat dissipation pattern 5b, it is possible to reduce contact resistance at the sections where they contact. Because a large current flows from the transparent cathode 13 of each OLED light-emitting element, it is possible to reduce power consumption within a circuit by reducing contact resistance at each contact section as described above. Consequently, it is possible to achieve a reduction in power consumption across the entire OLED display panel 100.

According to an organic EL display panel of the present invention formed as described above, dissipating heat generated from a circuit on an OLED display panel to the exterior becomes easy using a structure which can rapidly reduce costs.

What is claimed is:
1. An OLEO display panel arranged with an organic light-emitting element configured to emit light in response to a signal supplied from a terminal electrode, the panel comprising:
   a substrate;
   a metal film formed above the substrate;
   an insulation film formed above the metal film;
   a drive circuit layer including a circuit formed above the insulation film for driving the organic light-emitting element based on the signal;
   a metal contact configured to pass through the insulation film and the drive circuit layer and having one end contacting with the metal film; and a heat dissipation pattern of a metal film formed above the drive circuit layer to contact with the other end of the metal contact.

2. The OLEO display panel according to claim 1, wherein the heat dissipation pattern is conductive with the terminal electrode for connecting to ground.

3. The OLEO display panel according to claim 1 further comprising:

a heat dissipation tape bridged between the heat dissipation pattern and a heat dissipation structured body.

4. The OLEO display panel according to claim 3, wherein the heat dissipation structured body is a metal frame.

5. The OLED display panel according to claim 3, wherein the substrate is arranged above the heat dissipation structured body.

6. The OLEO display panel according to claim 1, wherein the organic light-emitting element is formed on an opposite side to the substrate side of the drive circuit layer, the drive circuit is formed outside a region formed with the organic light-emitting element in the drive circuit layer, and the metal film is formed on the substrate side of the drive circuit and not formed on the substrate side of the organic light-emitting element.

7. The OLEO display panel according to claim 1, wherein the organic light-emitting element is formed on an opposite side to the substrate side of the drive circuit layer, the drive circuit is formed outside a region formed with the organic light-emitting element in the drive circuit layer, and the metal film is formed on the substrate side of the drive circuit and the organic light-emitting element.

8. The OLEO display panel according to claim 1, wherein the organic light-emitting element includes an electrode configured to pass through the drive circuit layer and the insulation film and conduct with the metal film.

9. The OLEO display panel according to claim 8, wherein the electrode conducting with the metal film is a cathode of the organic light-emitting element.

10. The OLEO display panel according to claim 1, wherein the contact exists on the exterior side of a display region arranged with the organic light-emitting element.

* * * * *